(12) United States Patent
Melanson et al.

(10) Patent No.: US 10,230,355 B2
(45) Date of Patent: *Mar. 12, 2019

(54) ADJUSTABLE TIME DURATION FOR DRIVING PULSE-WIDTH MODULATION (PWM) OUTPUT TO REDUCE THERMAL NOISE

(71) Applicant: Cirrus Logic International Semiconductor Ltd., Edinburgh (GB)

(72) Inventors: John L. Melanson, Austin, TX (US); Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/790,863

(22) Filed: Oct. 23, 2017

(65) Prior Publication Data

US 2018/0048295 A1   Feb. 15, 2018

Related U.S. Application Data

(63) Continuation of application No. 15/491,476, filed on Apr. 19, 2017, now Pat. No. 9,847,773, which is a continuation of application No. 14/971,109, filed on Dec. 16, 2015, now Pat. No. 9,660,632.

(51) Int. Cl.
| | |
|---|---|
| *H03K 3/011* | (2006.01) |
| *H03M 1/82* | (2006.01) |
| *H03F 3/217* | (2006.01) |
| *H03K 7/08* | (2006.01) |
| *H03F 1/30* | (2006.01) |

(52) U.S. Cl.
CPC ............. *H03K 3/011* (2013.01); *H03F 1/303* (2013.01); *H03F 3/2171* (2013.01); *H03K 7/08* (2013.01); *H03M 1/822* (2013.01)

(58) Field of Classification Search
CPC ...... H03K 7/08; H03K 17/687; H03K 17/168; H03K 3/013; H03K 5/04
USPC ................................. 327/172, 173, 174, 175
See application file for complete search history.

(56) References Cited

U.S. PATENT DOCUMENTS

| | | |
|---|---|---|
| 6,738,003 B2 | 5/2004 | Melanson |
| 6,885,330 B2 | 4/2005 | Trotter et al. |
| 2006/0071697 A1* | 4/2006 | Mels ...................... H03F 3/217 327/175 |

(Continued)

FOREIGN PATENT DOCUMENTS

KR   20020034677 A   5/2002

*Primary Examiner* — John W Poos
(74) *Attorney, Agent, or Firm* — Norton Rose Fulbright US LLP

(57) ABSTRACT

Noise introduced in an output signal of a pulse-width modulator (PWM) may be reduced by changing the time duration that a switch is driving the output node. Because the power supplies coupled to the switches are the source of noise in the output signal of the PWM, the time duration that the power supplies are driving the output may be reduced to obtain a subsequent reduction in noise in the output signal. For example, when a small signal is desired to be output by the PWM, the switches may be operated for shorter time durations. Thus, the switches couple the noise sources to ground for a duration of a cycle to reduce contribution of noise to the output. But, when a larger signal is desired to be output by the PWM, the switches may be operated for longer time durations or the conventional time durations described above.

20 Claims, 8 Drawing Sheets

(56) References Cited

U.S. PATENT DOCUMENTS

2009/0302911 A1* 12/2009 Wang .................... H03K 3/017
327/172
2010/0085097 A1    4/2010 Bryant
2010/0141225 A1*  6/2010 Isham .................. H02M 3/156
323/282
2014/0340124 A1* 11/2014 Hirler ................. H03K 17/168
327/108

* cited by examiner

ADJUSTABLE TIME DURATION FOR DRIVING PULSE-WIDTH MODULATION (PWM) OUTPUT TO REDUCE THERMAL NOISE

FIELD OF THE DISCLOSURE

This application is a continuation of U.S. patent application Ser. No. 15/491,476 to Melanson et al. filed on Apr. 19, 2017, and entitled "Adjustable Time Duration for Driving Pulse-Width Modulation (PWM) Output to Reduce Thermal Noise," which is a continuation of U.S. patent application Ser. No. 14/971,109 to Melanson et al. filed on Dec. 16, 2015 and entitled "Adjustable Time Duration for Driving Pulse-Width Modulation (PWM) Output to Reduce Thermal Noise," which issued as U.S. Pat. No. 9,660,632, each of which is incorporated by reference in its entirety.

FIELD OF THE DISCLOSURE

The instant disclosure relates to signal modulation. More specifically, portions of this disclosure relate to pulse-width modulation (PWM) with reduced noise.

BACKGROUND

Information can be represented as signals in numerous manners. One such manner is modulation, in which information is encoded by varying the properties of a carrier signal. One example of modulation is amplitude modulation (AM) employed in AM radios. In an AM radio signal, an amplitude of a signal at a fixed frequency is varied over time according to the information to be conveyed. Another example of modulation is pulse width modulation (PWM). Pulse-width modulation (PWM) is frequently used in electronic devices and telecommunications, such as mobile phones, to transmit information from one point to another point, whether that is across a circuit board or across miles of airwaves. Pulse-width modulation (PWM) encodes data as a series of pulses in a pulsing signal. The pulses are generated by a circuit, such as the one illustrated in FIG. 1.

FIG. 1 is a circuit schematic showing a conventional pulse-width modulator. A modulator 110 may include switches 116 and 118 coupled to positive and negative power supplies, respectively. The switches 116 and 118 may be configured to drive an output node 102 when coupled to node 112 and not drive the output node 102 when coupled to node 114. Control signals CTRL1 and CTRL2 supplied to switches 116 and 118 may couple the switches 116 and 118 to node 112 to generate pulses at the output node 102. For example, an average zero output may be generated by applying the control signals illustrated in FIG. 2A to the switches 116 and 118 of FIG. 1. A first control CTRL1 signal 202 and a second control CTRL2 signal 204 may be high at time 212 to couple the switch 116 to node 112 and the switch 118 to node 114. At time 214, the switches 116 and 118 reverse such that switch 116 is coupled to node 114 and switch 118 is coupled to node 112. As another example, an average positive output may be generated by applying the control signals illustrated in FIG. 2B to the switches 116 and 118 of FIG. 1. A first control CTRL1 signal 206 may go high at time 212, followed by a second control CTRL2 signal 208 at time 216. Now, the output at output node 102 is an average of the strength of the drive from switches 116 and 118 but weighted by the amount of time that each of the switches is coupled to the node 112. When the drive from switches 116 and 118 is equal, the output at output node 102 is a positive pulse between time 212 and time 214, because the first control CTRL1 signal causes the switch 116 to be coupled to node 112 for a longer duration that control CTRL2 signal causes the switch 118 to be coupled to node 112.

In the pulse-width modulation (PWM) technique described above with reference to FIG. 1, the output at output node 102 is not a perfect signal. Noise is generated by the power supplies for the switches 116 and 118, and that noise becomes part of the output at output node 102. One type of noise introduced by the switches 116 and 118 is thermal noise. Thermal noise is variations in the driving of the node 112 that occur as a result of thermal fluctuations within the power sources for the switches 116 and 118. The thermal fluctuations may be due to environmental changes or heat produced by operating the power sources. In conventional pulse-width modulation (PWM) techniques described above, thermal noise is always present in the output signal because the switches 112 and 118 are never both coupled to node 114. Instead, one of the switches 116 and 118 is always driving the output node 102.

As electronics continue to advance, the total power consumed by the devices is reduced resulting in large problems with noise. The power consumption reduction is often due to a decrease of the magnitude of the supply voltages of the electronics necessitated by a shrink of the transistors that are the building blocks of the electronics. The sources of noise, such as thermal noise in power supplies, does not necessarily decrease along with the power consumption. Thus, the relative contribution of noise to the output signal increases as power consumption decreases. Because many applications require a sufficient signal-to-noise ratio (SNR), the noise introduced by the power sources is a problem when a signal level is small.

Shortcomings mentioned here are only representative and are included simply to highlight that a need exists for improved electrical components, particularly for pulse-width modulators employed in consumer-level devices, such as mobile phones. Embodiments described herein address certain shortcomings but not necessarily each and every one described here or known in the art.

SUMMARY

Noise introduced in an output signal of a pulse-width modulator (PWM) may be reduced by changing the time duration that a switch is driving the output node. Because the power supplies coupled to the switches are the source of noise in the output signal of the PWM, the time duration that the power supplies are driving the output may be reduced to obtain a subsequent reduction in noise in the output signal. For example, when a small signal is desired to be output by the PWM, the switches may be operated for shorter time durations. Thus, the switches couple the noise sources to ground for a duration of a cycle to reduce contribution of noise to the output. This switching technique may be implemented in one embodiment as a duty cycle of less than fifty percent for the switches. But, when a larger signal is desired to be output by the PWM, the switches may be operated for longer time durations or the conventional time durations described above.

According to one embodiment, an apparatus may include an output node; a first source for driving the output node in a positive direction; a first switch coupled to the first source and to the output node, in which the first switch is configured such that when connected in a first phase drives the output node in a positive direction and contributes noise and when connected in a second phase does not contribute to output noise or drive the output node in any direction; a second source for driving the output node in a negative direction; a second switch coupled to the second source and to the output node, in which the second switch is configured such that when connected in a third phase drives the output node in a negative direction and contributes noise and when connected in a fourth phase does not contribute to output noise or drive the output node in any direction; and/or a controller coupled to the first switch and coupled to the second switch. The controller may be configured to perform steps including receiving a reference signal; operating the first switch and the second switch to generate a pulse width modulation (PWM) representation of the reference signal at the output node; and/or adjusting a time duration that the first switch and the second switch are coupled to the output node based, at least in part, on an envelope level of a desired output signal at the output node.

In certain embodiments, the controller may be configured to perform steps including adjusting the time duration that the first switch and the second switch are coupled to the output node proportional to the envelope level; in a first mode, coupling the first switch and the second switch to the output node for a first duration of time; in a second mode, coupling the first switch and the second switch to the output node for a second duration of time shorter than the first duration of time; switching between the first mode and the second mode based, at least in part, on the envelope level; switching from the first mode to the second mode when the envelope level is at least 10 decibels below full scale; adjusting the time duration based, at least in part, on an amplitude of the reference signal; adjusting the time duration based, at least in part, on a desired volume level; operating the first switch for a longer duration of time than the second switch to generate a pulse; and/or coupling the first switch and the second switch to the output node with a duty cycle below fifty percent.

In certain embodiments, the first source may be stronger than the second source, and the controller may be configured to operate the first switch for a longer duration of time than the second switch to generate a positive pulse at the output node.

According to another embodiment, a method may include receiving, by a controller, a reference signal; operating, by the controller, a first switch and a second switch of a pulse width modulator to generate a pulse width modulation (PWM) representation of the reference signal at an output node, wherein the first switch is operated in a first phase to drive an output node in a positive direction and contribute noise and in a second phase to not contribute to output noise or drive the output node in any direction, and wherein the second switch is operated in a third phase to drive the output node in a negative direction and contribute noise and in a fourth phase to not contribute to output noise or drive the output node in any direction; and/or adjusting, by the controller, a time duration that the first switch and the second switch are coupled to the output node based, at least in part, on an envelope level of a desired output signal.

In certain embodiments, the step of adjusting the time duration may include adjusting the time duration proportional to the envelope level; the step of adjusting the time duration may include for a first range of the envelope level, coupling the first switch and the second switch to the output node for a first duration of time; the step of adjusting the time duration may include for a second range of the envelope level, coupling the first switch and the second switch to the output node for a second duration of time shorter than the first duration of time; the step of adjusting the time duration comprises switching from the first duration of time to the second duration of time when the envelope level is at least 10 decibels below full scale; the step of adjusting the time duration may be based, at least in part, on an amplitude of the reference signal; and/or the step of adjusting the time duration may be based, at least in part, on a desired gain level.

According to another embodiment, an apparatus may include a pulse width modulation controller configured to control a pulse width modulator at least by switching a first switch to and from an output node and by switching a second switch to and from the output node to generate a pulse width modulation (PWM) representation of a reference signal at the output node, wherein the first switch is operated in a first phase to drive the output node in a positive direction and contribute noise and in a second phase to not contribute to output noise or drive the output node in any direction, wherein the second switch is operated in a third phase to drive the output node in a negative direction and contribute noise and in a fourth phase to not contribute to output noise or drive the output node in any direction, and wherein the pulse width modulation controller is configured to adjust a time duration within a cycle that the first switch and the second switch are both coupled to the output node based, at least in part, on an envelope level of a desired output signal at the output node.

In certain embodiments, the controller may be configured to adjust the time duration proportional to the envelope level; the controller is configured to adjust the time duration by, for a first range of the envelope level, coupling the first switch and the second switch to the output node for a first duration of time; the controller may be configured to adjust the time duration by, for a second range of the envelope level, coupling the first switch and the second switch to the output node for a second duration of time shorter than the first duration of time; the controller may be configured to switch from the first duration of time to the second duration of time when the envelope level is at least 10 decibels below full scale;

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Noise in an output signal of a pulse-width modulator (PWM) may be reduced by decreasing the amount of time the sources of the noise are coupled to the output node of the pulse-width modulator. For example, the time that switches are switched on to couple power sources to the output node may be reduced in comparison to the conventional techniques, resulting in a corresponding decrease of thermal noise contributed to the output signal of the PWM. Operation of the switches may be controlled by the control signals illustrated in FIG. 3A.

Figure 3A:
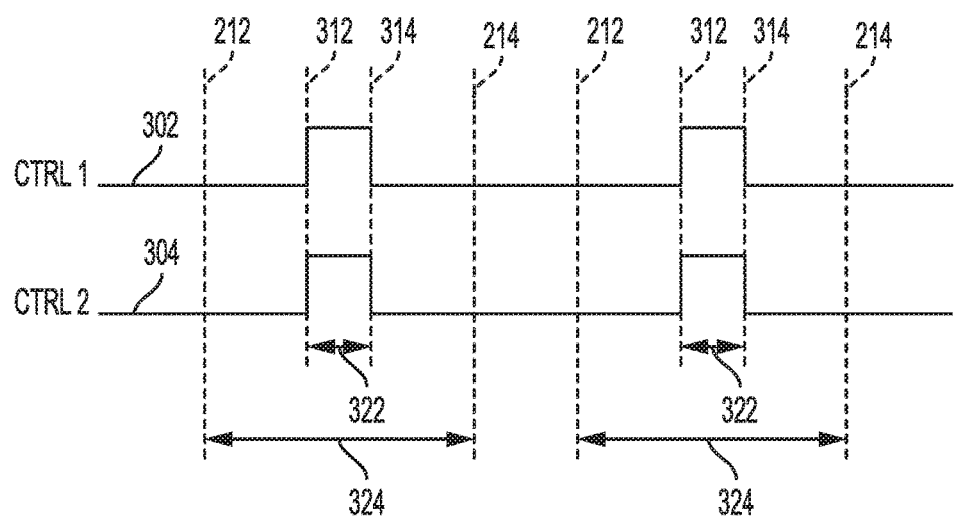
FIG. 3A are graphs illustrating control signals for operating a pulse-width modulator with reduced noise to generate a zero output according to one embodiment of the disclosure.

FIG. 3A are graphs illustrating control signals for operating a pulse-width modulator with reduced noise to generate a zero output according to one embodiment of the disclosure. A first control CTRL1 signal 302, along with a second control CTRL2 signal 304, may go high at time 312 to switch switches that couple the power source to the output node. The control signals CTRL1 and CTRL2 may go low at time 314 to switch the power sources coupled to the output node. A time duration 322 during which the power sources are coupled to the output node of the pulse-width modulator (PWM) is shorter in time than a time duration 324 between corresponding times 212 and 214 of the prior art.

Figure 3B:
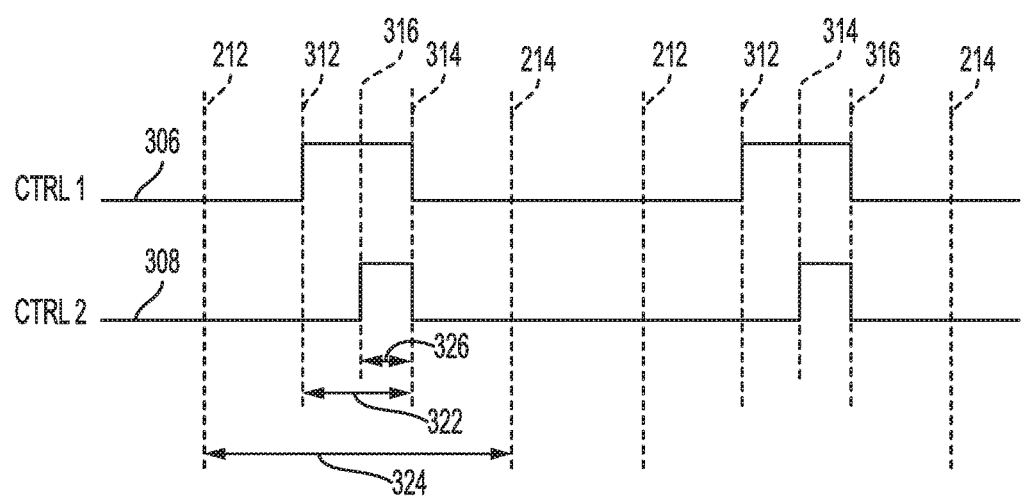
FIG. 3B are graphs illustrating control signals for operating a pulse-width modulator with reduced noise to generate a positive output according to one embodiment of the disclosure.

Likewise, FIG. 3B are graphs illustrating control signals for operating a pulse-width modulator with reduced noise to generate a positive output according to one embodiment of the disclosure. A first control CTRL1 signal 306 may go high at time 312 to switch on switches that couple the power source to the output node. A second control CTRL2 signal 308 may go high at time 316 after time 312. Then, the control CTRL1 and CTRL2 signals 306 and 308 may go low at time 314. As with the control signals of FIG. 3A, the time duration 322 and time duration 326 that the switches couple the power supplies to the output node is reduced from the time duration 324 of the prior art. Thus, a reduction in noise at the output of the pulse-width modulator (PWM) may be achieved.

The time duration 322 of the control pulses for operating switches may vary based on a reference input signal that is being converted to a pulse-width modulation representation. That is, the time duration may be based on a desired output level for the pulse-width modulator that is indicated by the reference input signal. If a larger input signal is detected and a larger output thus desired, the time duration may be increased; if a smaller input signal is detected and a smaller output thus desired, the time duration may be decreased. Smaller and larger may refer to an envelope level of the input or output signal. The desired envelope level may be dictated by factors such as a desired volume or an amplitude of the reference input signal. Control of a pulse-width modulator (PWM) may be performed according to the method illustrated in FIG. 4.

Figure 4:
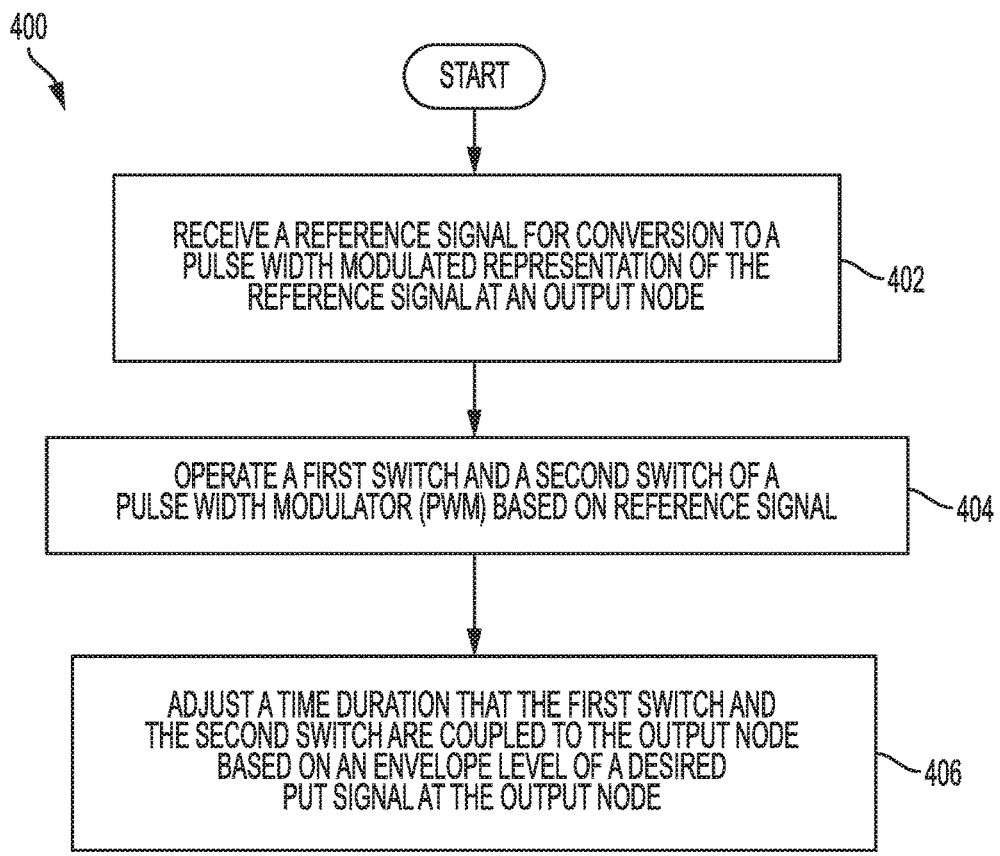
FIG. 4 is a flow chart illustrating operation of a pulse-width modulator to adjust a time duration that switches are active according to one embodiment of the disclosure.

FIG. 4 is a flow chart illustrating operation of a pulse-width modulator to adjust a time duration that switches are active according to one embodiment of the disclosure. A method 400 begins at block 402 with receiving a reference input signal for conversion to a pulse-width modulated output signal that is representative of the reference input signal. Then, at block 404, a first switch and a second switch of the pulse-width modulator may be operated based on the reference input signal. At block 406, a time duration that the first switch and the second switch are coupled to the output node may be adjusted based on an envelope level of a desired output signal at the output of the pulse-width modulator. The step of block 406 may occur in real time with the operation of the switches in block 404, such that the time duration is dynamically changing in response to the continued input received as the reference input signal.

Figure 5:
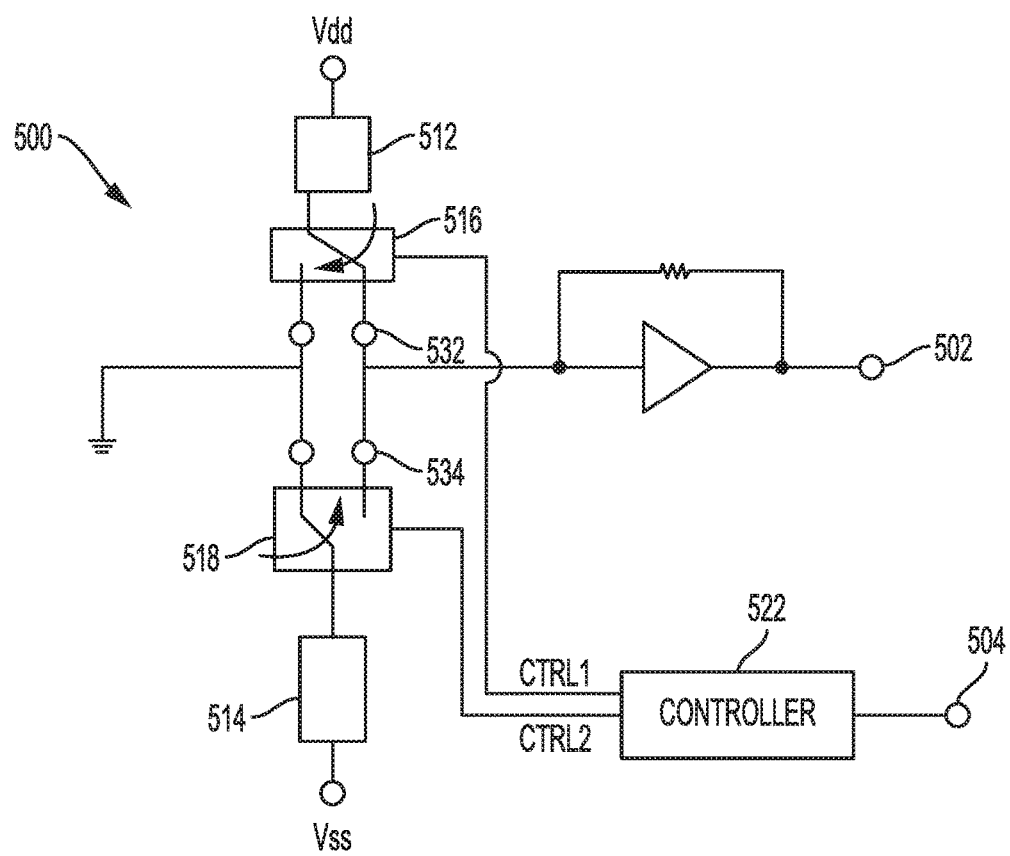
FIG. 5 is a circuit schematic illustrating a pulse-width modulator operated by a controller to adjust time duration that switches are active according to one embodiment of the disclosure.

The method of FIG. 4 may be implemented in a pulse-width modulator, in one embodiment, in a controller configured to operate switches of the pulse-width modulator, such as the controller illustrated in FIG. 5. FIG. 5 is a circuit schematic illustrating a pulse-width modulator operated by a controller to adjust time duration that switches are active according to one embodiment of the disclosure. A portion of a pulse-width modulator (PWM) 500 may include switches 516 and 518 configured to couple power supplies 512 and 514 to nodes 532 and 534, respectively. A switch 516 may toggle between coupling the power supply 512 to the node 532 to drive an output at output node 502 in a positive direction and coupling the power supply 512 to ground. A switch 518 may toggle between coupling the power supply 514 to the node 534 to drive an output node 502 in a negative direction and coupling the power supply 514 to ground.

A controller 522 may be configured to operate the switches 516 and 518 by outputting control signals CTRL1 and CTRL2 that toggle the switches 516 and 518. The controller 522 may be coupled to an input node 504 for receiving a reference input signal for conversion to a pulse-width representation at output node 502. Although only one set of switches 516 and 518 and corresponding power sources 512 and 514 is illustrated in FIG. 5, additional sets of switches and power sources may be included. For example, a finite impulse response (FIR) filter may include many of the sets of switches 516 and 518, such as between 8 and 128. The power sources 512 and 514 may be, for example, current sources that drive current to a node selected by the switches 516 and 518.

The controller 522 may generate control CTRL1 and CTRL2 signals with various time durations selected according to a desired envelope level of an output signal generated at output node 502. The controller 522 may implement shorter time durations by generating control CTRL1 and CTRL2 signals similar to those shown in FIG. 3A and FIG. 3B. The controller 522 may implement longer time durations by generating control CTRL1 and CTRL2 signals similar to those shown in FIG. 2A and FIG. 2B. The shorter time duration and longer timer duration may be switched according to an algorithm executed by the controller 522. One such algorithm is illustrated in FIG. 6.

Figure 1:
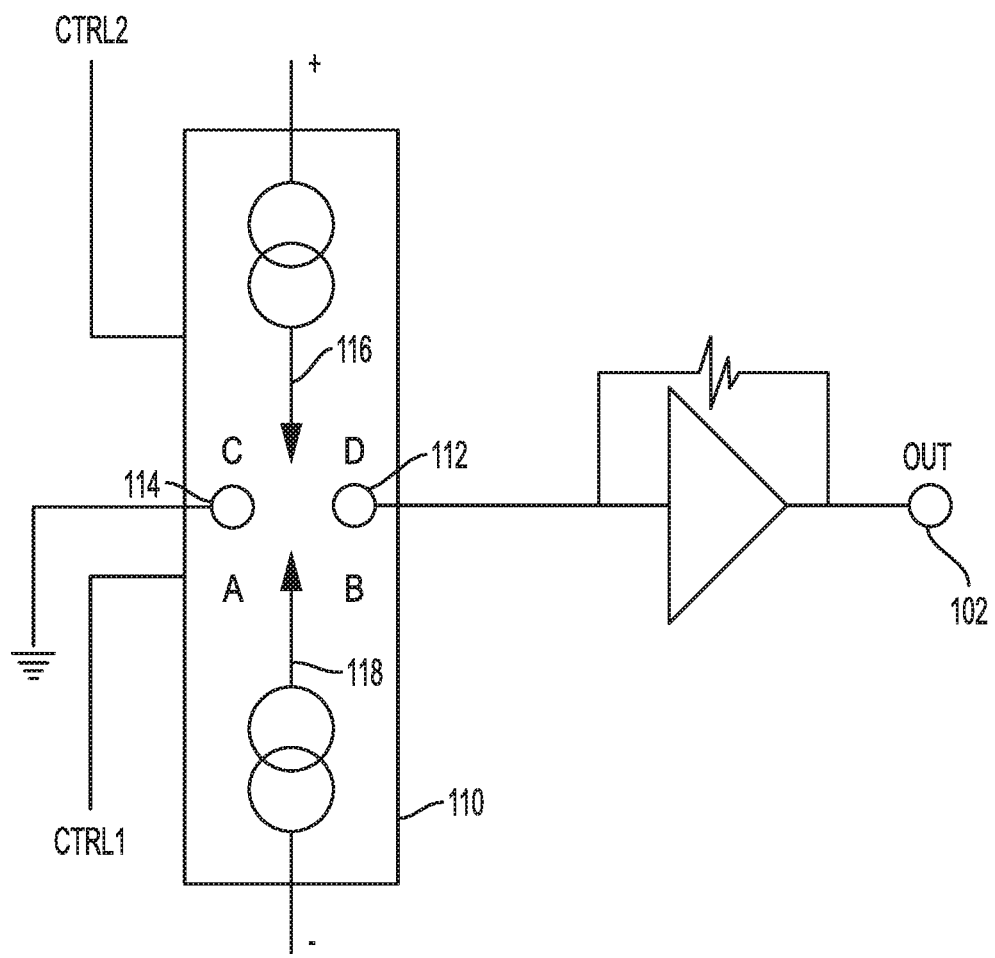
FIG. 1 is a circuit schematic showing a conventional pulse-width modulator.
Figure 2A:
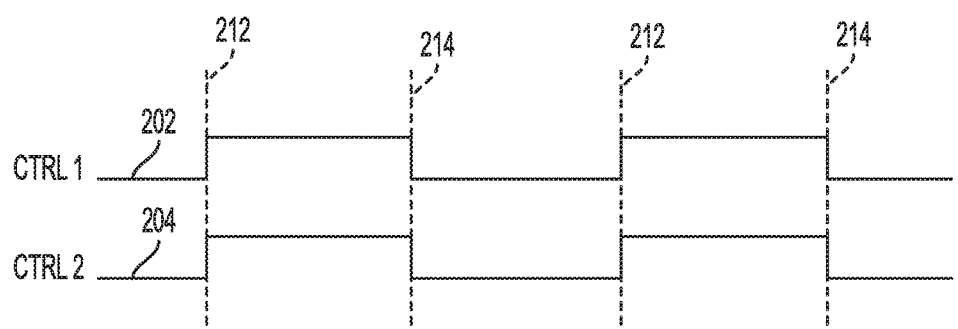
FIG. 2A are graphs illustrating control signals for operating the circuit of FIG. 1 to generate a zero output.
Figure 2B:
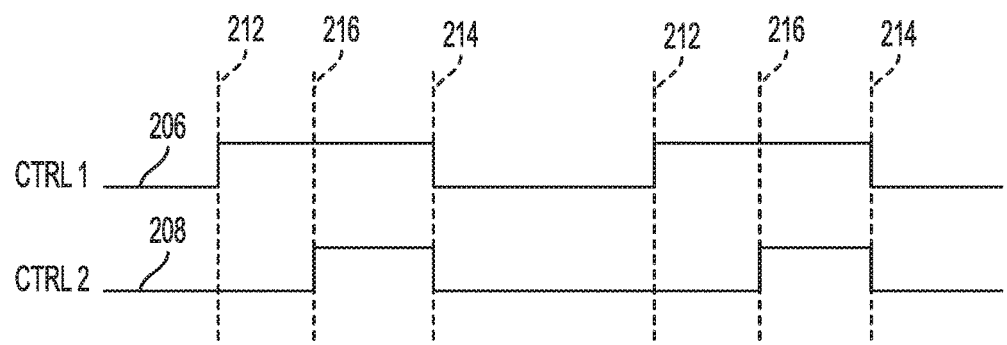
FIG. 2B are graphs illustrating control signals for operating the circuit of FIG. 1 to generate a positive output.
Figure 6:
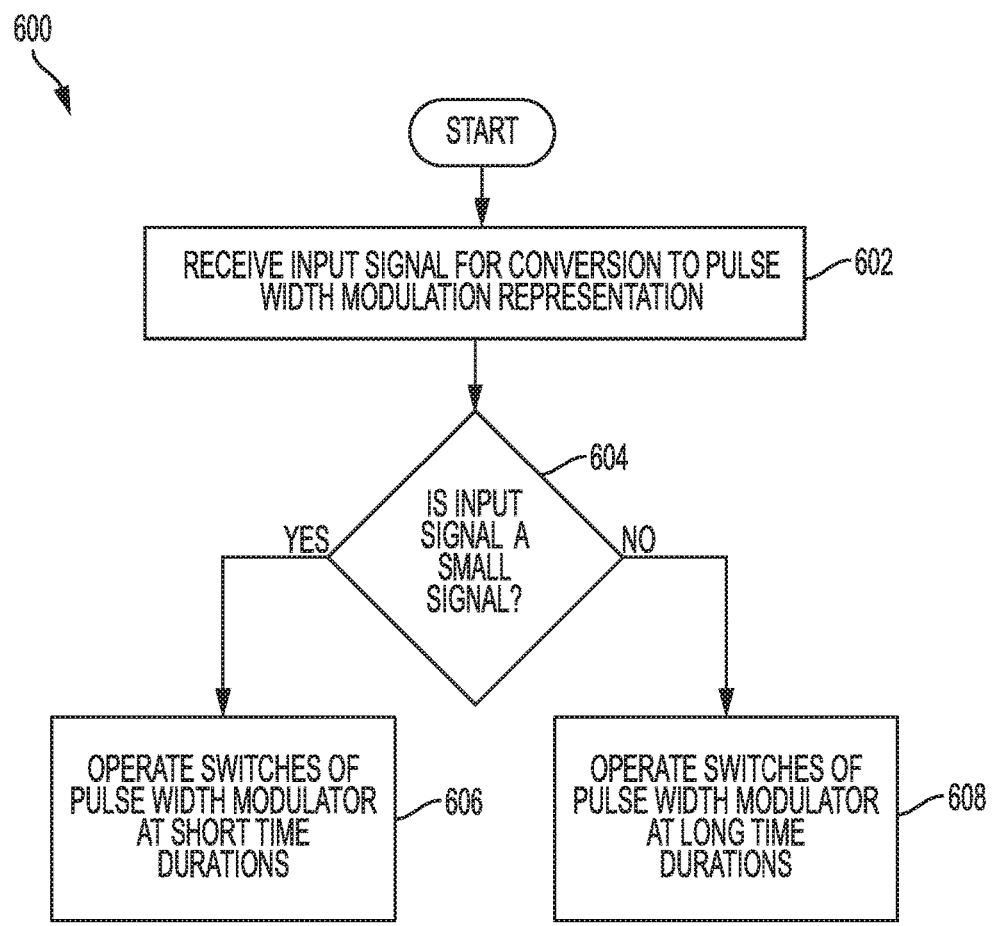
FIG. 6 is a flow chart illustrating a method of operating switches of a pulse-width modulator by a controller to reduce noise according to one embodiment of the disclosure.

FIG. 6 is a flow chart illustrating a method of operating switches of a pulse-width modulator by a controller to reduce noise according to one embodiment of the disclosure. A method 600 begins at block 602 with the controller receiving a reference input signal for conversion to a pulse-width modulation representation. At block 604, the controller determines whether the reference input signal is a small signal or not a small signal. A small signal, in one embodiment, may be a signal with signal-to-noise ratio (SNR) of 20 decibels (dB) or less. A small signal in other embodiments, may be a signal with a signal-to-noise ratio (SNR) of 10 decibels (dB) or less or may be a signal with a SNR of 60 decibels (dB) or less. Alternatively or additionally, the block 604 may include determining whether an envelope level of a desired output signal is a small signal. When a small signal is detected at block 604, the method 600 proceeds to block 606 to operate switches of the pulse-width modulator at short time durations. For example, block 606 may be implemented by the controller 522 operating the switches 516 and 518 of FIG. 5 with the control CTRL1 and CTRL2 signals illustrated in FIG. 3A and FIG. 3B. Referring back to FIG. 6, when a small signal is not detected at block 604, the method 600 proceeds to block 608 to operate switches of the pulse-width modulator at long time durations. For example, block 608 may be implemented by the controller 522 operating the switches 516 and 518 of FIG. 5 with the control CTRL1 and CTRL2 signals illustrated in FIG. 2A and FIG. 2B. Although the signals of FIG. 2A and FIG. 2B are mentioned, any time duration longer than the short time duration of block 606 may be implemented at block 608.

Figure 7:
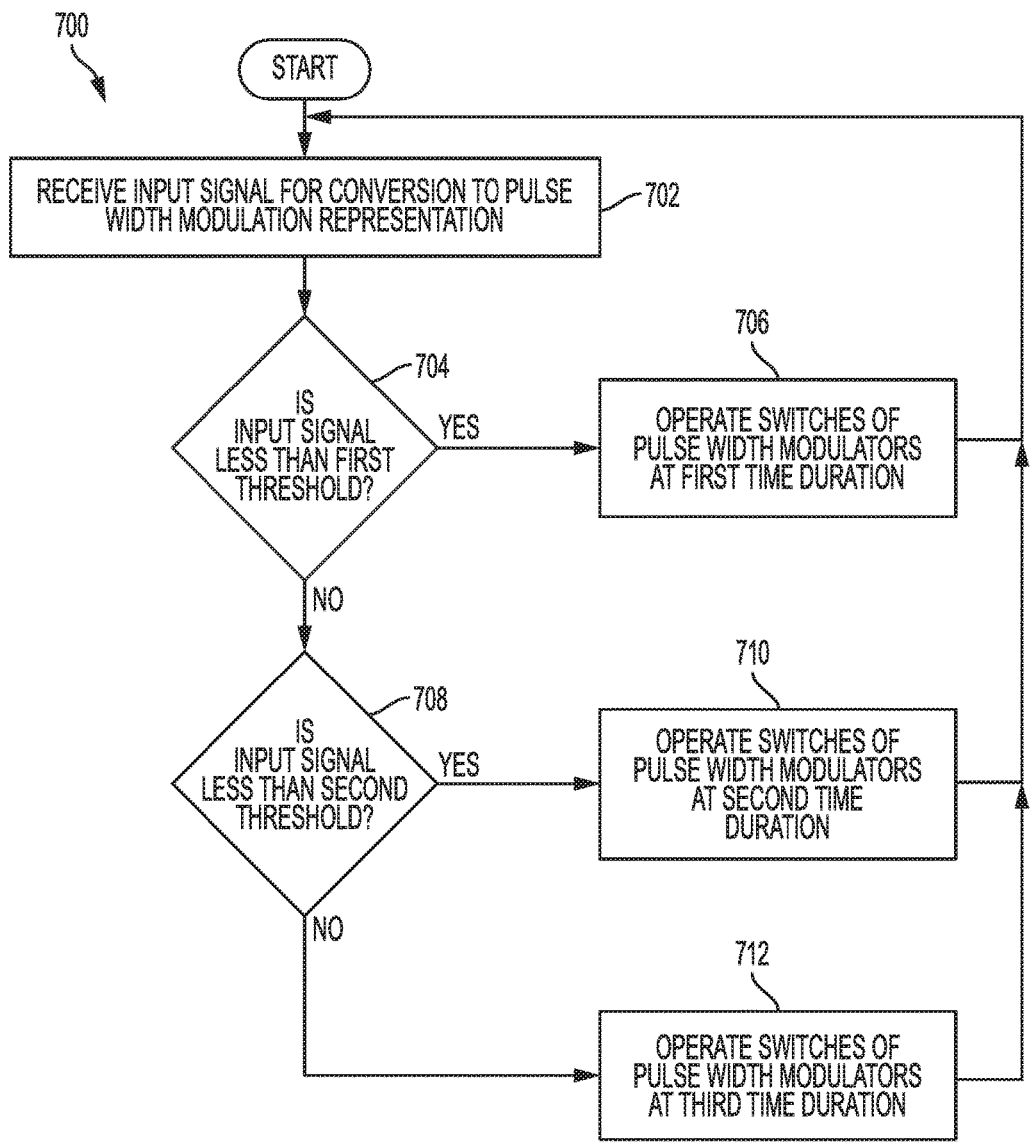
FIG. 7 is a flow chart illustrating a method of operating switches of a pulse-width modulator by a controller using predefined thresholds to reduce noise according to one embodiment of the disclosure.

The time duration adjustment of FIG. 6 illustrates two time durations, however, a large number of time durations may be implemented by the controller 522, such as when executing the method illustrated in FIG. 7. FIG. 7 is a flow chart illustrating a method of operating switches of a pulse-width modulator by a controller using predefined thresholds to reduce noise according to one embodiment of the disclosure. A method 700 begins at block 702 with receiving a reference input signal for conversion to a pulse-width representation. At block 704, the controller determines if the input signal is smaller than a first threshold. If so, the method 700 proceeds to block 706 to operate the switches using a first time duration. If not, then the method 700 proceeds to block 708 where the controller determines if the input signal is smaller than a second larger threshold. If so, the method 700 proceeds to block 710 to operate the switches using a second longer time duration. If not, then the method 700 proceeds to block 712 to operate the switches using a third still longer time duration that is longer than both the first and second time durations. Alternatively or additionally, the blocks 704 and 708 may include determining whether a desired envelope level of an output signal is less than a first or second threshold.

Although thresholds are shown in FIG. 6 and FIG. 7 and used by the controller for adjusting the time duration of operating the switches, the time duration may also be set in a continuous or nearly continuous manner. For example, the time duration may be set proportional to an amplitude or envelope level of the reference input signal. In this embodiment, the time duration may be set based on a formula using the amplitude or envelope level of the reference input signal as a variable.

The schematic flow chart diagrams of FIG. 4, FIG. 6, and FIG. 7 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although "high" and "low" signals are described, these are only relative terms and thus the embodiments disclosed herein may be easily modified to instead operate when signals "go low" or "go high." As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a controller coupled to a plurality of switches for generating a pulse-width modulation signal at an output node, and wherein the controller is configured to:
receive an input signal for conversion to a pulse width modulation representation;
determining whether the input signal is a small signal by determining whether the input signal is below a threshold level;
operate the plurality of switches at short time durations having a first time duration when the input signal is a small signal; and
operate the plurality of switches at long time durations having a second time duration that is longer than the first time duration when the input signal is not a small signal.

2. The apparatus of claim 1, wherein the controller is configured to operate the plurality of switches at short time durations by operating at least one of the plurality of switches with a duty cycle of less than fifty percent.

3. The apparatus of claim 1, wherein the controller is configured to generate the pulse-width modulation signal at the output node by operating a first switch and a second switch of the plurality of switches to generate a pulse width modulation (PWM) representation of the input signal at the output node.

4. The apparatus of claim 3, wherein the controller is further configured to:
adjust a time duration that the first switch and the second switch are coupled to the output node based, at least in part, on an envelope level of a desired output signal at the output node, wherein the adjustment comprises:
in a first mode, coupling the first switch and the second switch to the output node for the first time duration;
in a second mode, coupling the first switch and the second switch to the output node for the second time duration; and
switching between the first mode and the second mode based, at least in part, on the envelope level.

5. The apparatus of claim 4, wherein the controller is configured to adjust the time duration that the first switch is in the first phase and that the second switch is in the third phase such that the time duration is shorter at lower desired output signal levels.

6. The apparatus of claim 3, wherein the first switch is configured such that when connected in a first phase drives the output node in a positive direction and contributes noise and when connected in a second phase does not contribute to output noise or drive the output node in any direction, and wherein the second switch is configured such that when connected in a third phase drives the output node in a negative direction and contributes noise and when connected in a fourth phase does not contribute to output noise or drive the output node in any direction.

7. The apparatus of claim 3, wherein the controller is configured to adjust the time duration based, at least in part, on a desired volume level.

8. The apparatus of claim 1, wherein the controller is configured to determine whether the input signal is a small signal comprises determining whether an envelope level of the input signal is below the threshold level.

9. The apparatus of claim 1, wherein the controller is configured to determine whether the input signal is a small signal comprises determining whether the input signal is at least 10 decibels (dB) below full scale.

10. The apparatus of claim 1, wherein the step of determining whether the input signal is a small signal comprises determining whether the input signal is below 60 decibels (dB).

11. A method, comprising:
receiving an input signal for conversion to a pulse width modulation representation at an output node;
determining whether the input signal is a small signal by determining whether a the input signal is below a threshold level;
operating the plurality of switches at short time durations having a first time duration when the input signal is a small signal; and
operating the plurality of switches at long time durations having a second time duration that is longer than the first time duration when the input signal is not a small signal.

12. The method of claim 11, wherein the step of operating the plurality of switches at short time durations comprises operating at least one of the plurality of switches with a duty cycle of less than fifty percent.

13. The method of claim 11, wherein the step of generating the pulse-width modulation signal comprises operating a first switch and a second switch of the plurality of switches to generate a pulse width modulation (PWM) representation of the input signal at the output node.

14. The method of claim 13, adjusting a time duration that the first switch and the second switch are coupled to the output node based, at least in part, on an envelope level of a desired output signal at the output node, wherein adjusting comprises:
in a first mode, coupling the first switch and the second switch to the output node for the first time duration;
in a second mode, coupling the first switch and the second switch to the output node for the second time duration; and
switching between the first mode and the second mode based, at least in part, on the envelope level.

15. The method of claim 13, wherein the first switch is configured such that when connected in a first phase drives the output node in a positive direction and contributes noise and when connected in a second phase does not contribute to output noise or drive the output node in any direction, and wherein the second switch is configured such that when connected in a third phase drives the output node in a negative direction and contributes noise and when connected in a fourth phase does not contribute to output noise or drive the output node in any direction.

16. The method of claim 15, further comprising adjusting the time duration that the first switch is in the first phase and that the second switch is in the third phase such that the time duration is shorter at a lower desired output signal.

17. The method of claim 14, further comprising adjusting the time duration based, at least in part, on a desired volume level.

18. The method of claim 11, wherein the step of determining whether the input signal is a small signal comprises determining whether an envelope level of the input signal is below the threshold level.

19. The method of claim 11, wherein the step of determining whether the input signal is a small signal comprises determining whether the input signal is at least 10 decibels (dB) below full scale.

20. The method of claim 11, wherein the step of determining whether the input signal is a small signal comprises determining whether the input signal is below 60 decibels (dB).

* * * * *